United States Patent
Wu

(10) Patent No.: US 6,358,676 B1
(45) Date of Patent: Mar. 19, 2002

(54) METHOD FOR REWORKING PHOTORESIST

(75) Inventor: Shu-Ching Wu, Hsinchu (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/483,130

(22) Filed: Jan. 14, 2000

(30) Foreign Application Priority Data

Oct. 22, 1999 (TW) ........................................ 088118350

(51) Int. Cl.$^7$ .............................. G03F 7/42; G03F 7/40
(52) U.S. Cl. ........................................ 430/329; 430/30
(58) Field of Search ................................. 430/329, 30

(56) References Cited

U.S. PATENT DOCUMENTS

| | | | | |
|---|---|---|---|---|
| 3,890,176 A | * | 6/1975 | Bolon | 252/79.1 |
| 5,677,113 A | * | 10/1997 | Suzuki et al. | 430/329 |
| 5,977,041 A | * | 11/1999 | Honda | 510/175 |
| 6,030,754 A | * | 2/2000 | Atnip | 430/329 |
| 6,191,046 B1 | * | 2/2001 | Singh et al. | 438/723 |
| 6,207,358 B1 | * | 3/2001 | Jeon et al. | 430/329 |

FOREIGN PATENT DOCUMENTS

KR          9613149          *   9/1996

* cited by examiner

*Primary Examiner*—Cynthia Hamilton
(74) *Attorney, Agent, or Firm*—Powell, Goldstein, Frazer & Murphy LLP

(57) ABSTRACT

An improved method for reworking photoresist is provided for decreasing cycle time of photoresist reworking process. A semiconductor substrate with an underlying layer is provided for patterning. A photoresist pattern is formed on the underlying layer. A photoresist reworking process is performed after an after-development-inspection (ADI) is performed. The photoresist reworking method comprises the following steps. The semiconductor substrate is placed in organic stripper for removing the most portion of the photoresist pattern. Subsequently, the semiconductor substrate is placed in a single-wafer processor and an UV/O$_3$ dry ashing is then performed to remove completely the residual photoresist pattern on the underlying layer. A new photoresist layer is deposited on the underlying layer after the photoresist pattern removed completely.

13 Claims, 1 Drawing Sheet

METHOD FOR REWORKING PHOTORESIST

FIELD OF THE INVENTION

The present invention relates to a semiconductor process, and more particularly, to an improved method of removing photoresist from a semiconductor substrate to improve photoresist rework process and reduce the cycle time.

BACKGROUND OF THE INVENTION

During the manufacture of semiconductors and semiconductor microcircuits, it is frequently necessary to coat the photoresist materials on the substrate. In a photolithographic process, the photoresist materials are pattern delineation that are evenly and completely removed from all unexposed areas in the case of positive photoresists, so as to permit further lithographic operation. These patterns define different active regions of the circuit, for example, diffusion regions, gate regions, contact regions or interconnection regions and so on, which allow the necessary ion implantation, etching or diffusion process to be performed. The photoresists are used as masking materials to form patterns on to the substrate during etching to protect the selected areas of the surface of the substrate while etchant selectively attacks the unprotected area of the substrate.

The photoresists are developed it is desired to measure the critical dimensions of the pattern as well as to verify their integrity before the pattern is etched. After development, an inspection (sometimes referred to as an after-develop-inspection, ADI) is performed. The purpose is to insure that the steps of the photoresist process up to this point have been performed correctly and to a point within the specified tolerance. Mistakes or unacceptable process variations can be corrected, since the photoresist process has not yet produced any changes to the wafer substrate. Thus, any inadequately processed wafers or wafers, that are misaligned, of unacceptable critical dimension, and embody defective pattern detected by the inspection can have the photoresists stripped or reworked. A misaligned photoresist pattern or a defective photoresist pattern must be removed for reimaging after development and inspection.

There are three types of photoresist stripping methods: organic strippers, oxidizing-type inorganic strippers and dry etching. An alternative method of removing photoresist involves burning the remaining photoresist from the photoresist-covered substrate by oxygen plasma. This process is known as oxygen plasma ashing. Recently, the oxygen plasma ashing method has become the preferred method for removal of photoresist because oxygen plasma can easily burn photoresist to vaporized substances, for example, $CO_2$, $CO$, $H_2O$ and thus remove the photoresist film from the substrate. Also, this dry process is carried out in a vacuum chamber and is less susceptible to particulate or metallic contamination. However, sidewall polymers and other inorganic substances may still be present after the ashing process is complete. Hence, additional steps after oxygen plasma ashing are necessary to remove these residues completely.

One preferred treatment is shown in FIG. 1, the oxygen plasma ashing (step 11) is carefully applied first to partially remove the photoresist film. Subsequently, a wet stripping (step 12) is applied to completely remove organic photoresists, as well as inorganic plasma etching residues in the final step. In the final step, removal of the partially removed photoresists and plasma etching residual is accomplished by exposing the substrate to a wet stripper. For example, sulfuric acid ($H_2SO_4$) is used before metal layers, and amine solution is used after metal layers. The main objective in photoresist stripping is to insure that all the photoresist is removed as quickly as possible without attacking any underlying surface materials, especially metal layers.

However, these processes have numerous shortcomings, especially for photoresist reworking. The long stripping time of the processes limits production rate and increases the per-wafer cost of production. In addition, these processes are batch-type, if we have only two wafers need to be reworked, we must spend much time to wait for a batch of reworked wafers for batch-type rework processes. It will increase a cycle time of rework processes, which is about 0.5 to 1.5 days per wafer while the Fab is fully loaded. Thus, the conventional photoresist reworking process has a long cycle time and a large cost.

Thus, there is a need to provide an improved method of reworking photoresist to reduce the cycle time and increase the throughput.

SUMMARY OF THE INVENTION

An object of the present invention is to provide an improved process for removing photoresist in less time than prior processes.

Another other object of the present invention is to provide an improved process for reworking misaligned photoresist patterns to reduce cycle time.

The present invention discloses an improved method for reworking photoresist. A semiconductor substrate with an underlying layer is provided for patterning. A positive photoresist is formed on the underlying layer. A photoresist reworking process is performed after an after-development-inspection (ADI) procedure. The photoresist reworking method comprises the following steps. The semiconductor substrate is placed in wet stripper for removing the most portion of the photoresist pattern. Subsequently, the semiconductor substrate is placed in a single-wafer processor and a $UV/O_3$ dry ashing is then performed to remove completely the residual photoresist pattern and expose the underlying layer. A new photoresist layer is deposited on the underlying layer after the photoresist pattern removed completely.

BRIEF DESCRIPTION OF THE DRAWINGS

The present invention is illustrated by way of example and not limitation in the figures of the accompanying drawings.

DETAILED DESCRIPTION OF THE PRESENT INVENTION

The present invention discloses an improved method for reworking photoresist and shortening the total process time to completely remove the photoresist material. The method is especially suitable for performing in single-wafer processor equipment. A wet stripping is firstly performed for removing a most portion of the reworked photoresist. A dry ashing method is then performed for completely removing the residual reworked photoresist. The method of disclosed invention could significantly shorten the cycle time of the photoresist reworking.

In semiconductor processes for defining a special pattern on a wafer, a photoresist layer is firstly deposited on an underlying layer would be pattern. The underlying layer is a dielectric layer, a semiconductor layer, or a conductor layer. Subsequently, a standard photolithographic process is performed for transferring the pattern on the mask to the photoresist layer. After the photoresist layer is exposed selectively through the mask, the exposed photoresist layer is then developed by developer to form the pattern photoresist layer. The pattern photoresist layer is used as a hard mask for defining the pattern on the underlying layer. An exposed region of the photoresist layer is dissolved by the developer and a unexposed regionof the photoresist layer remains while the photoresist layer is positive photoresist material. However, the exposed region of the photoresist layer remains while the photoresist layer is negative photoresist material.

An after-development-inspection (ADI) is performed after the pattern photoresist mask formed on the underlying layer. ADI is usually used to examine photoresist pattern to determine the feature of critical dimension and alignment or any residue or debris remained in the developed pattern. This is the only point at which a rework of photoresist is possible that the underlying layer is not etched. The scanning electron microscope (SEM) is a most common tool for ADI. If the feature dimensions of photoresist pattern is not within tolerance specifications or residue has remained, the photoresist pattern must be reworked. A photoresist process is performed afresh after the defective photoresist pattern is removed completely.

Figure 1:
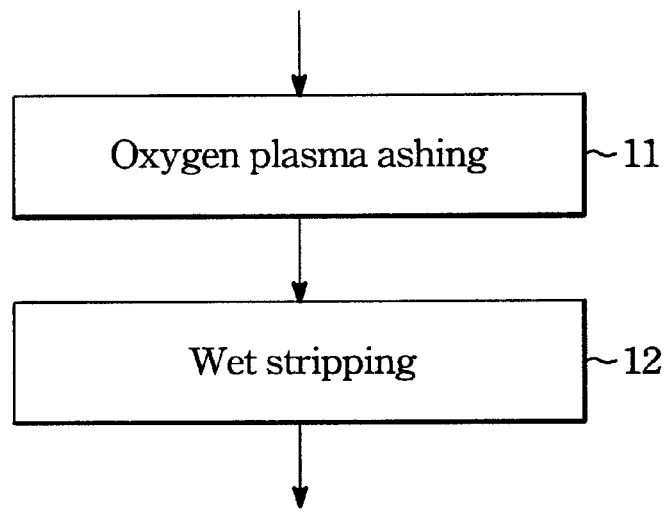
FIG. 1 is a flowchart illustrating steps according to the conventional photoresist stripping.
Figure 2:
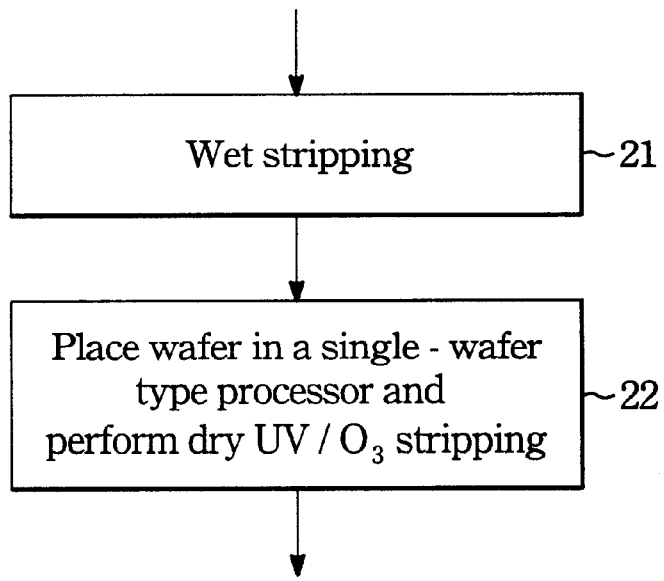
FIG. 2 is a flowchart illustrating steps according to the method of the present invention for decreasing the cycle time of photoresist reworking.

Referring to the FIG. 2, this shows a flowchart illustrating steps according to the method of the present invention for decreasing the cycle time of photoresist reworking. The SEM causes the surface of the photoresist pattern to become hardened or charging and difficult to remove from the underlying layer. A wet stripping is performed first in the present invention (step 21). The wafer for reworking photoresist is placed in wet stripper. In a preferred embodiment, the wet stripper includes dimethyl sulfoxide (DMSO) and 1-methyl-2-pyrrolidone (NMP). The wet stripper with polar functional group has a good solubility for organic compound as photoresist material. The photoresist pattern is stripped instantly by the feature of "like dissolves like". Most of the portion of the photoresist pattern has removed at this point.

Subsequently, the wafer with photoresist residue is placed in a single-wafer processor and a dry ashing is performed to completely remove the photoresist residue (step 22). A subsequently photoresist process is performed afresh without any photoresist residue. In a preferred embodiment, a large number radical is generated by $UV/O_3$ for removing the photoresist residue. The mechanism of the reaction is shown as follows:

(1)

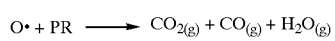
(2)

Wherein the PR is illustrated as being of photoresist that is a hydrocarbon compound composite of carbon and hydrogen.

As mentioned above with respect to dry ashing, the UV energy is used for transferring an ozone molecule to an oxygen molecule and high-energy oxygen radical. A wavelength of the UV source is about 160 to 280 nm. Then, the high-energy radical reacts with the hydrocarbon compound of the photoresist to generate small molecules including carbon dioxide ($CO_2$), carbon monoxide (CO), and water ($H_2O$). These small molecules can easily vaporize from the surface of the wafer. Thus, the residue photoresist on the wafer surface can be removed completely and rapidly by the $UV/O_3$ dry ashing. The dry ashing can be an oxygen plasma ashing while the photoresist material is negative photoresist.

As mentioned above, the present application discloses a method of reworking photoresist for removing photoresist rapidly. A wet stripping is performed first to remove most of the portion of the photoresist pattern that is harden for charging in SEM. The wet stripper with polar functional group has high solubility for organic photoresist. A $UV/O_3$ dry ashing is then performed to remove completely the residual photoresist pattern on the wafer surface. A new photoresist layer is deposited on the underlying layer after the photoresist pattern is removed completely. The disclosed method is performed in a single-wafer processor. The cycle time of the claimed photoresist reworking method is decreased to one hour from one day as is the case in the conventional method. Thus, the improved method of reworking photoresist according to the present invention reduces the cycle time and increases the throughput efficiently.

As is understood by a person skilled in the art, the foregoing preferred embodiment of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for reworking photoresist on a semiconductor substrate, said semiconductor substrate has an underlying layer thereon, and a photoresist pattern is formed on said underlying layer, wherein delineations of said photoresist pattern are not within tolerance specifications after an after-development-inspection (ADI) and must be reworked, said method comprising:

performing a wet stripping process by an organic stripper to remove a most part of said photoresist pattern, wherein said organic stripper comprises dimethyl sulfoxide (DMSO) and 1-methyl-2-pyrrolidone (NMP);

performing a dry stripping process to remove said photoresist pattern and expose said underlying layer completely in a single-wafer processor; and forming a photoresist pattern layer afresh on said exposed underlying layer.

2. The method according to claim 1, wherein said underlying layer is a dielectric layer.

3. The method according to claim 1, wherein said underlying layer is a semiconductor layer.

4. The method according to claim 1, wherein said underlying layer is a conductor layer.

5. The method according to claim 1, wherein said photoresist pattern is formed of positive photoresist material.

6. The method according to claim 5, wherein said dry stripping is used by an $UV/O_3$ dry stripping.

7. The method according to claim 1, wherein said photoresist pattern is formed of negative photoresist material.

8. The method according to claim 7, wherein said dry stripping is used by an oxygen plasma dry stripping.

9. A method for reworking photoresist on a semiconductor substrate, said semiconductor substrate has an underlying layer thereon, and a positive photoresist pattern is formed on said underlying layer, wherein delineations of said positive photoresist pattern are not within tolerance specifications after an after-development-inspection (ADI) and must be reworked, said method comprising:

performing a wet stripping process by an organic stripper to remove a most part of said positive photoresist pattern, wherein said organic stripper comprises dimethyl sulfoxide (DMSO) and 1-methyl-2-pyrrolidone (NMP);

performing a dry stripping process by UV/ozone to remove said positive photoresist pattern and expose said underlying layer completely in a single-wafer processor; and forming a positive photoresist pattern layer afresh on said exposed underlying layer.

10. The method according to claim 9 wherein said underlying layer is a dielectric layer.

11. The method according to claim 9, wherein said underlying layer is a semiconductor layer.

12. The method according to claim 9, wherein said underlying layer is a conductor layer.

13. A method for stripping photoresist, said method comprising the steps of:

forming an underlying layer on said semiconductor substrate;

forming a positive photoresist pattern on said underlying layer;

performing an after-development-inspection (ADI) to examine delineations of said positive photoresist pattern;

performing a wet stripping process by an organic stripper to remove a most part of said positive photoresist pattern, wherein said organic stripper comprises dimethyl sulfoxide (DMSO) and 1-methyl-2-pyrrolidone (NMP); and performing a dry stripping process by UV/ozone to remove said positive photoresist pattern completely in a single-wafer processor.

* * * * *